(12) United States Patent
Meckel

(10) Patent No.: US 11,346,414 B2
(45) Date of Patent: May 31, 2022

(54) BRAKE DISK AND METHOD OF MAKING SAME

(71) Applicant: Tech M3, Inc., Poway, CA (US)

(72) Inventor: Nathan K. Meckel, Ramona, CA (US)

(73) Assignee: TECH M3, INC., Poway, CA (US)

( * ) Notice: Subject to any disclaimer, the term of this patent is extended or adjusted under 35 U.S.C. 154(b) by 0 days.

(21) Appl. No.: 17/171,692

(22) Filed: Feb. 9, 2021

(65) Prior Publication Data

US 2022/0003286 A1    Jan. 6, 2022

Related U.S. Application Data

(63) Continuation of application No. 16/889,361, filed on Jun. 1, 2020, now Pat. No. 10,948,036, which is a continuation of application No. 12/195,994, filed on Aug. 21, 2008, now Pat. No. 10,670,095.

(60) Provisional application No. 60/971,879, filed on Sep. 12, 2007, provisional application No. 60/957,422, filed on Aug. 22, 2007.

(51) Int. Cl.
| *F16D 65/12* | (2006.01) |
| *C23C 14/50* | (2006.01) |
| *C23C 14/02* | (2006.01) |
| *F16D 65/02* | (2006.01) |
| *F16D 55/00* | (2006.01) |
| *F16D 69/00* | (2006.01) |

(52) U.S. Cl.
CPC ............ *F16D 65/12* (2013.01); *C23C 14/028* (2013.01); *C23C 14/505* (2013.01); *F16D 65/127* (2013.01); *F16D 2055/0062* (2013.01); *F16D 2065/1332* (2013.01); *F16D 2069/004* (2013.01); *F16D 2250/003* (2013.01); *F16D 2250/0046* (2013.01); *Y10T 29/49986* (2015.01)

(58) Field of Classification Search
CPC ...... F16D 65/12; F16D 65/125; F16D 65/127; F16D 65/128; F16D 2055/0062; F16D 2065/1132; F16D 2069/0004; F16D 2250/003; F16D 2250/0046; C23C 14/028; C23C 14/505
See application file for complete search history.

(56) References Cited

U.S. PATENT DOCUMENTS

| 6,793,057 | B1 * | 9/2004 | Smith, Jr. ............... | F16D 13/70 |
| | | | | 192/107 M |
| 9,388,087 | B2 * | 7/2016 | Don ....................... | C03C 3/064 |
| 9,416,831 | B2 * | 8/2016 | Nixon ..................... | F16D 55/36 |
| 10,012,279 | B2 * | 7/2018 | Wall ....................... | F16D 55/225 |
| 10,197,121 | B2 * | 2/2019 | Filip ...................... | F16D 65/127 |
| 10,895,295 | B2 * | 1/2021 | Filip ...................... | F16D 65/127 |
| 2013/0248305 | A1 * | 9/2013 | Choi ....................... | C04B 35/83 |
| | | | | 188/218 XL |
| 2014/0145460 | A1 * | 5/2014 | Niessner ............. | B60B 17/0006 |
| | | | | 295/30 |

(Continued)

*Primary Examiner* — Thomas W Irvin
(74) *Attorney, Agent, or Firm* — The Dobrusin Law Firm, PC

(57) ABSTRACT

A brake disk or drum has at least one working surface which opposes a braking member such as a brake pad or shoe. A plurality of spaced, raised island formations are provided across the working surface, with channels extending between the island formations. Each raised island formation has an outer surface which contacts a brake pad or brake shoe during braking.

20 Claims, 4 Drawing Sheets

(56) References Cited

U.S. PATENT DOCUMENTS

| | | | |
|---|---|---|---|
| 2015/0369314 A1* | 12/2015 | Filip | F16D 65/12 |
| | | | 188/218 XL |
| 2015/0369315 A1* | 12/2015 | Wall | F16D 55/225 |
| | | | 188/18 A |
| 2016/0273601 A1* | 9/2016 | Broda | F16D 65/125 |
| 2019/0368560 A1* | 12/2019 | Filip | C23C 14/34 |
| 2021/0381563 A1* | 12/2021 | Filip | F16D 65/127 |
| 2022/0003286 A1* | 1/2022 | Meckel | C23C 14/028 |

\* cited by examiner

BRAKE DISK AND METHOD OF MAKING SAME

RELATED APPLICATION

The present application is a continuation of U.S. application Ser. No. 16/889,361, filed Jun. 1, 2020, which is a continuation of U.S. application Ser. No. 12/195,994, filed Aug. 21, 2008, which claims the benefit of U.S. provisional patent application No. 60/957,422, filed Aug. 22, 2007 and U.S. provisional patent application No. 60/971,879, filed Sep. 12, 2007, each of which are incorporated herein by reference in its entirety.

BACKGROUND

1. Field of the Invention

The present invention pertains generally to brake disks (also referred to as rotors) and drums made of cast iron, carbon steel, stainless steel or a ceramic/metal composite material with a functionally engineered friction surface, and to methods of making such brake disks.

2. Related Art

During braking, hydraulic energy is used to press the vehicle's brake pads against the rotating brake disk. The friction resulting from the moving contact between brake pad and brake disk slows the rotation of the brake disk and decreases the speed of the vehicle. This frictional contact generates heat and causes the contact surfaces on the brake pad and brake disk to wear unevenly. Excessive wear can cause the brake disk to become thin and weak resulting in warpage and brake fade. In some cases, the thinning of the brake disk becomes so severe that the brake disk is no longer able to support the stresses and heat generated during braking. The result is typically a warped brake disk that can cause undesirable brake chattering and an unsafe brake system.

A factor that can be considered when designing brake rotors is aesthetics. Modern motorcycles have rather large diameter brake disks that are plainly visible, especially the front disk(s). Because of this visibility, the color and surface appearance of a brake disk can add to or detract from the overall look of the motorcycle. These considerations can affect a purchaser's decision when buying a new motorcycle and also when retrofitting a motorcycle with a new brake system.

In view of the foregoing, there are a number of reasons why it is important for a brake disk (also sometimes referred to as a brake rotor) to dissipate heat while at the same time to be wear and corrosion resistant. First, the ability of the brake disk to dissipate heat helps eliminate the possibility of brake fade, wear and subsequent warpage. This, in turn, would potentially lead to a longer service life for the brake rotor. A longer service life translates into reduced maintenance and the associated costs. Additionally, the ability of the brake disk to dissipate heat faster would result in less brake fade which would add to the safety aspects of the overall braking system. A final consideration, which is especially important for brake disks used on motorcycles (or wherever the brake disk is exposed to general view), is the appearance of the brake disk.

SUMMARY

Embodiments described herein provide coated brake disks that have raised island formations integrated into one or both of the parallel working surfaces of the disk with channels extending between the island formations that improve the dissipation of the heat generated during the braking process, and methods for making such brake disks with integral island formations. The outer surfaces of the island formations may be generally flat and act as the friction surfaces which engage the opposing brake pad on braking. In one embodiment, a brake disk is disk-shaped having a central hole (or in some cases multiple holes) to allow the brake disk to be positioned over a hub and attached to a motor vehicle. The brake disk is further formed with a pair of annular surfaces that extend from the central hole to the periphery of the brake disk, and each annular surface has a plurality of raised island formations or lands at spaced intervals across the surface, with channels defined in the spaces between adjacent island formations. The island formations are provided for contact with the brake pads during braking and constitute the wear or working surfaces for the brake disk. Island formations can be provided in any shape or size as long as they provide a sufficient friction or working surface area based on braking performance criteria. The island formations can also be designed to be ornamental in appearance to enhance the aesthetic appearance of exposed portions of the disk surfaces.

In accordance with some embodiments, the brake disk or rotor can be made of cast iron, stainless steel or a light weight ceramic material or ceramic composite material, or combinations thereof. One or both working surfaces include a plurality of spaced island formations on contact surfaces. The air flow channels between adjacent island formations allow for improved air flow over the working surface in order to improve dissipation of the heat generated during the braking process. The brake disks with the island formations are coated with or include a coating material that is wear and corrosion resistant. The coating material may have an aesthetically pleasing appearance and may be deposited on portions of the brake disk that are visible when the brake disk is installed on the vehicle. In one embodiment, the coating is deposited on the entire brake disk. Alternatively, the coating may be deposited only on the island formations. Coating materials of different colors or producing surface textures or appearances may be provided on different regions of the disk surfaces, for example on the island formations and channels between the island formations, for enhancing the appearance of the disk.

The specific size, shape, directional alignment, depth of air flow channels and the surface finish of the channels can be introduced to the brake disk surface by utilizing a variety of methods. The island formations may be imparted to the brake surfaces by various machining or forming techniques, including bead blasting, grinding, acid etching, laser etching, roll forming, embossing, stamping, honing, lapped, polished, blanched, milled, profiled or any other machined surface treatment or surface geometry modification and any combination(s) thereof.

In one embodiment, a surface finish or texture is produced on the entire area of the annular surface or on the island formations alone, prior to application of any coating layers. The desired surface texture may be produced by blasting the brake disk surface with a continuous stream of particles (commonly referred to as bead blasting) which are typically harder than the brake disk surface. These particles can be round in shape or very irregular in shape. The various particle shapes impart a different surface finish or surface geography to the brake disk. For example, with round particles (of various sizes) and appropriate particle energy (air pressure or hydro pressure) a surface texture that microscopically resembles low soft rolling hills can be achieved. With irregular (crystalline) shaped particles, a very coarse surface geometry (very rugged/jagged peaks and valleys) can be imparted to the brake disk surface. Other methods such as a sanded or a ground surface finish can be used to give a different appearance when coated with the wear and corrosion resistant coating. When the sanded or ground surface finish is done in a cross-hatched configuration and then coated with the wear and corrosion resistant coating, the coated brake disk can be made to look as though it has a woven appearance such as is found in components made from carbon fiber. In general, there are a multitude of surface finish techniques that can be utilized to impart a specific surface texture or geometry into the brake disk.

In one embodiment, a coating is deposited on all or part of the opposite annular surfaces of the brake disk. The coating may be applied only to the island formations which contact the brake pads, or may extend over the entire surface including the island formations and the channels between the island formations. In one embodiment, the coating includes a first layer of a material having either an amorphous structure (i.e. a non-crystalline structure), a crystalline structure, or a mixture of amorphous and crystalline structure materials. In a particular embodiment, the material of the first layer is a metal such as titanium, chromium, zirconium, aluminum, hafnium or an alloy thereof. The first layer is applied directly on the brake disk. The coating further includes a second layer that overlays and contacts the first layer. In one embodiment, the second layer includes one or more metal nitrides, metal borides, metal carbides and metal oxides. The second layer may include one or more nitrides, borides, carbides or oxides of the metal used in the first layer. For example, for a coating having titanium as the first layer, the second layer can be titanium nitride (TiN). Note; the abbreviations (e.g. TiN) are used herein as a shorthand rather than an exact chemical label, and do not suggest that the stoichiometry of the indicated compound must be exactly as stated in the abbreviation.

In one embodiment, after machining a brake disk with a selected arrangement of spaced island formations, and applying any desired surface finish, coating layers are applied using a physical vapor deposition source such as a cathodic arc source with a controlled gas atmosphere. Other operable techniques such as unbalanced magnetron sputtering or thermal evaporation may also be used. During coating deposition, the brake disks are positioned on a fixture and the fixture is rotated in a planetary movement about a central axis. In greater detail, the fixture includes three or more parallel poles that are mounted on a plate and arranged wherein each pole is spaced at an equal distance from the other poles. A plurality of brake disks can be stacked on each pole, with spacers to separate adjacent disks within each stack. The poles are spaced from each other to allow the brake disks on one pole to overlap the brake disks on an adjacent pole. The spacers prevent brake disks on one pole from contacting the brake disks on an adjacent pole.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

Certain embodiments as disclosed herein provide for brake disks with spaced raised surface portions or island formations having an aesthetically pleasing appearance and also providing air flow channels for cooling purposes between the adjacent island formations, as well as methods for making the brake disks.

After reading this description it will become apparent to one skilled in the art how to implement the invention in various alternative embodiments and alternative applications. However, although various embodiments of the present invention are described herein, it is understood that these embodiments are presented by way of example only, and not limitation. As such, this detailed description of various alternative embodiments should not be construed to limit the scope or breadth of the present invention as set forth in the appended claims.

Figure 1:
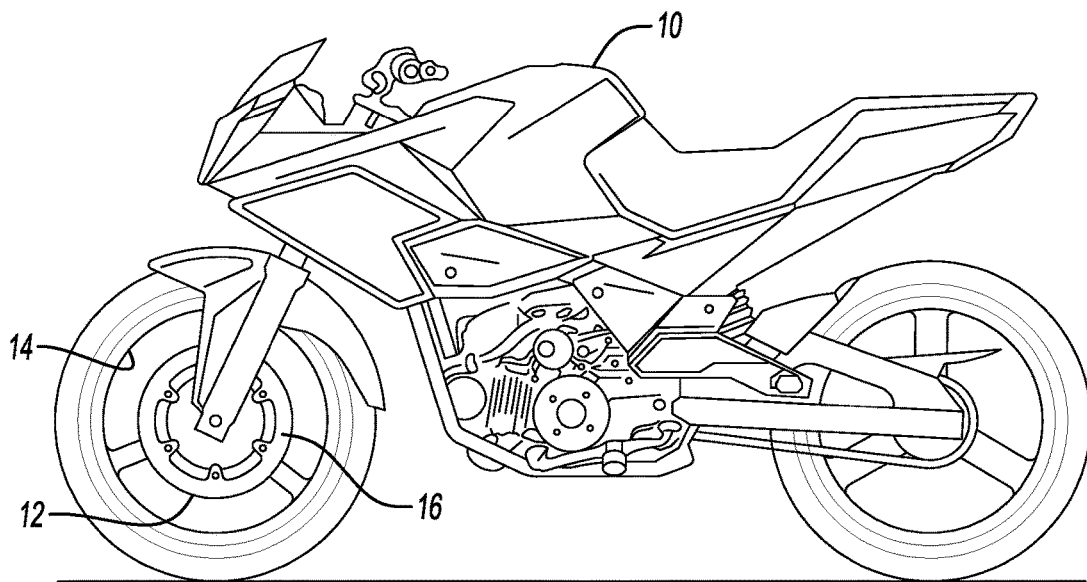
FIG. 1 is a perspective view of a motorcycle having a disk brake system.

Referring to FIG. 1, motorcycle 10 is shown that includes a disk brake system. As shown, the disk brake system includes a brake disk or rotor 12 that is attached to the front wheel 14 of the motorcycle 10 for rotation therewith. Typically two brake disks are attached to the front wheel of a motorcycle, and one or two brake disks are attached to the rear wheel. The brake system further includes a caliper 16 having a pair of brake pads that can be selectively applied against the brake disk 12 using hydraulic pressure to slow the rotation of the brake disk 12 and wheel 14. In a typical setup, the hydraulic pressure is provided by the motorcycle operator using a hand lever mounted on the handlebars of the motorcycle 10.

Figure 2:
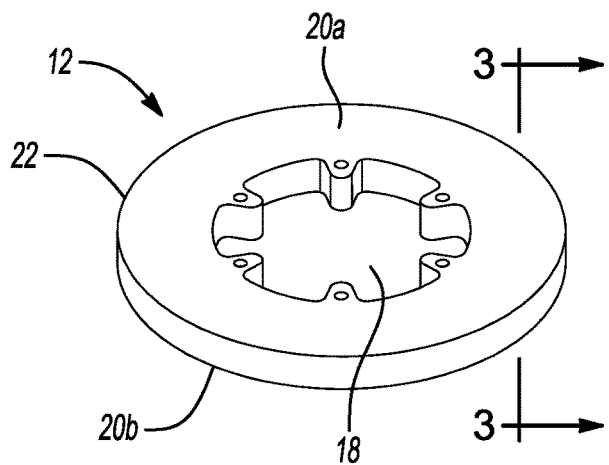
FIG. 2 is a perspective view of a coated disk brake.

A better appreciation of a brake disk 12 can be obtained with reference to FIG. 2. As shown, the brake disk 12 is disk-shaped having a central hole 18 to allow the brake disk 12 to be positioned over the hub of the wheel 14 (shown in FIG. 1). The brake disk 12 is further formed with annular working surfaces 20a,b (see also FIG. 4) that extend from the central hole 18 to the periphery 22 of the brake disk 12. As shown, surface 20a is parallel with and opposed to surface 20b on the brake disk 12. At least a portion of each of the surfaces 20a,b is designed for contact with the brake pads during braking, as described in more detail below. In one embodiment, a surface finish is applied to the annular surfaces prior to coating all or part of each surface with a wear and corrosion resistant coating, as described in more detail below.

Figure 9:
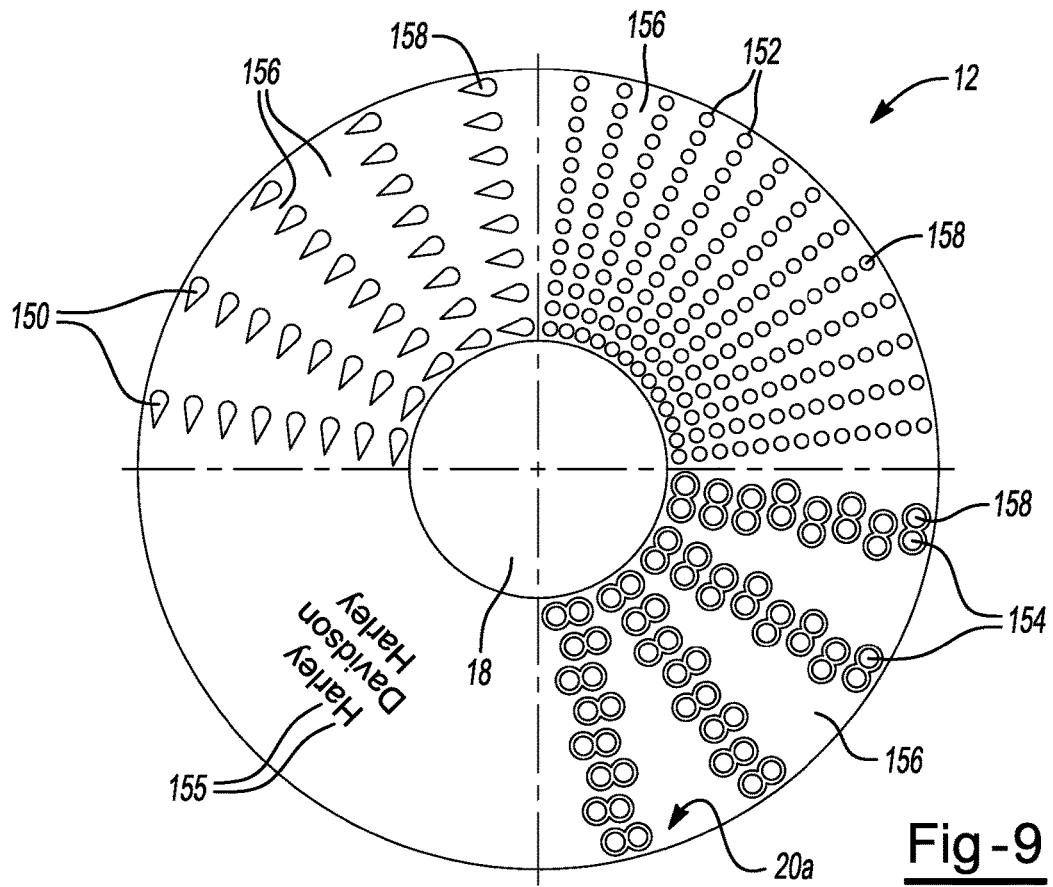
FIG. 9 is a perspective view of a brake rotor surface with four different surface modifications or "island formations".

In one embodiment, the annular surfaces 20a and 20b of brake disk 12 are provided with a plurality of raised land portions or island formations with spaced air flow channels between the island formations. Only the island portions contact the brake pads during braking in this arrangement, and comprise the wear surfaces of the brake disk 12. FIG. 9 illustrates some examples of possible land portions or island formations which may be provided on the opposite surfaces 20a and 20b of disk 12. In FIG. 9, four possible island formations are shown in the four quadrants of the exposed disc surface 20a; tear drop shaped formations 150, circle or dot shaped formations 152, figure eight shaped formations 154, and letter shaped formations 155, with channels or voids 156 between the island formations allowing air flow extending between the formations. As seen in three of the quadrants in FIG. 9, the island formations may be arranged in rows which extend radially from the central opening 18 of the disk out to the peripheral edge, with radial air flow channels extending outwardly between each adjacent pair of rows, in addition to channels which extend between adjacent pairs of island formations in each row. The island formations have upper surfaces 158 which are at least substantially flat friction surfaces for contact with the brake pads during braking, and are designed with sufficient surface areas for braking purposes. The four formations illustrated in FIG. 9 are examples of suitable island formations. Alternative island formations of different shapes and sizes may be engineered for cooling and wear in order to meet specific performance criteria in addition to providing an aesthetically pleasing appearance.

In one embodiment, spaced island formations of the shape shown in any one quadrant of FIG. 9 extend over the entire disk surface. Alternatively, island formations of any desired different shapes and sizes may be provided in patterns over the disk surface. The island formations can be of any size or shape including but not limited to; letters or names, numbers, logos, trademarks, dashes, other geometric shapes, and the like. The island formations can be designed to be aesthetically pleasing in appearance which is particularly desirable when the disk surfaces are externally visible, as is the case with many motor cycle brake disks (see FIG. 1). The grooves or channels around the island formations result in a significant reduction in the overall weight of the brake disk which in turn improves the efficiency and performance of the motor vehicle. Additionally, the channels allow for air flow around the island formations for increased cooling and heat dissipation. The base of each channel may be roughened or modulated to provide bumps or the like, creating turbulence in air flow along the channel which may produce enhanced cooling.

Island formations of the desired shape and dimensions may be formed in any suitable manner, for example by appropriate machining or other forming processes. After machining the desired island formations on one or both surfaces of the disk, the entire brake disk is coated with a wear and corrosion resistant coating 24 which eliminates or greatly reduces the wear of the island braking surfaces, as generally illustrated in FIG. 3A. Alternatively, the functional island braking surfaces alone may be coated with coating 24. The coating improves the overall look or aesthetics of the brake disk. In one embodiment, the coating includes a first layer of a metal, such as a pure titanium metal, and a second layer that includes a nitride, boride, carbide or oxide of the metal used in the first layer. The coating may be applied using a physical vapor deposition source such as a cathodic arc source with a controlled gas atmosphere. The materials used for coating 24 may be of different colors and may be designed to produce different surface appearances, such as a light reflective, shiny appearance, for example, particularly on regions of the surface which are visible when the brake disk is installed on a vehicle.

In one embodiment, a surface finish may be produced on the surfaces of the brake disk substrate, including the island formations, by blasting the brake disk surface with a continuous stream of particles (commonly referred to as bead blasting) which are typically harder than the brake disk surface. These particles can be round in shape or very irregular in shape. The various particle shapes impart a different surface finish or surface geography to the brake disk. For example, with round particles (of various sizes) and appropriate particle energy (air pressure or hydro pressure) a surface texture that microscopically resembles low soft rolling hills can be achieved. With irregular (crystalline) shaped particles, a very coarse surface geometry (very rugged/jagged peaks and valleys) can be imparted to the brake disk surface. Other methods such as a sanded or a ground surface finish can be used to give a different appearance when coated with the wear and corrosion resistant coating. When the sanded or ground surface finish is done in a cross-hatched configuration and then coated with the wear and corrosion resistant coating, the coated brake disk can be made to look as though it has a woven appearance such as is found in components made from carbon fiber. In general, there are a multitude of surface finish techniques that can be utilized to impart a specific surface texture or geometry into the brake disk prior to application of a coating 24. In one embodiment, selected surface finishes may be implemented as described in co-pending U.S. patent application Ser. No. 12/034,590 of Meckel filed on Feb. 20, 2008, the entire contents of which are incorporated herein by reference. In alternative embodiments, only the braking surfaces of the island formations may be treated to produce a surface texture, for example, by masking the channels between the island formations during bead blasting or other surface treatments.

Figure 3B:
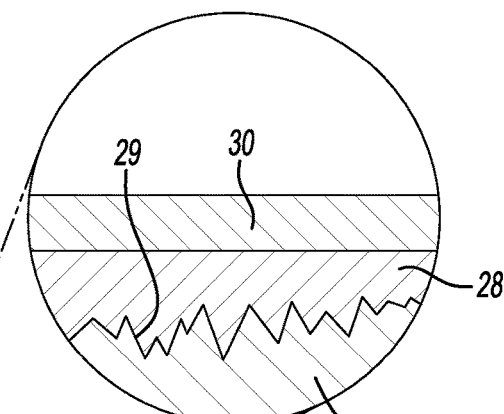
FIG. 3B is an enlarged cross-sectional view of the circled area of the coated surface in FIG. 3A, illustrating one embodiment of a surface texture applied to the surface of the disk substrate prior to application of the coating layers.
Figure 3A:
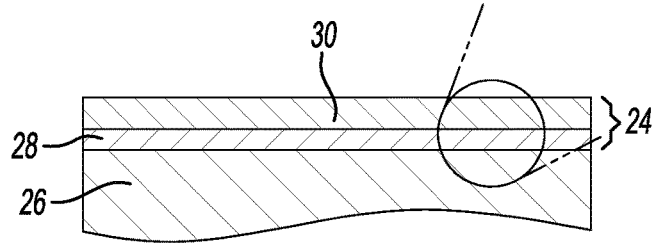
FIG. 3A is an enlarged cross-sectional view of a portion of the coated disk brake shown in FIG. 2 as seen along line 3-3 in FIG. 2 showing the coating layers.

Coating 24 is shown applied to a brake disk substrate 26 in FIGS. 3A and 3B. The brake disk substrate or rotor 26 may be formed of any suitable material such as cast iron, stainless steel, light weight metal alloys, ceramic materials, ceramic composite materials, or combinations thereof. The coating 24 may be implemented in one embodiment using the fixtures, techniques and materials as described in co-pending application Ser. No. 12/034,590 referenced above, and in co-pending U.S. patent application Ser. No. 12/034,599 of Meckel filed on Feb. 20, 2008, the entire contents of which are incorporated herein by reference. The portion of the substrate 26 illustrated in FIG. 3A may be part of the top surface of an island formation, or part of the channel between adjacent island formations. As noted above, the entire surface of the disk (island formations and valleys or channels between island formations) may be coated. In alternative embodiments, the island formations only may be coated.

As further shown in FIG. 3A, the coating 24 includes a first layer 28 of a material having an amorphous structure (i.e. a non-crystalline structure) or a crystalline structure. In a particular embodiment, the amorphous or crystalline material is a metal such as titanium, chromium, zirconium, aluminum, hafnium or an alloy thereof. The coating 24 further includes a second layer 30 that overlays and contacts the first layer 28. Though the layers are depicted as distinct, in some embodiments, the layers intermingle or merge such that no distinct boundary exists between the layers. The second layer 30 can include one or more binary metals, for example, one or more metal nitrides, metal borides, metal carbides and metal oxides. The second layer can include one or more nitrides, borides, carbides or oxides of the metal used in the first layer. In some embodiments, the coating may comprise multiple layers of alternating metal and metal compound materials may be applied in order to impart specific physical properties to the brake disk or rotor. In some embodiments of a coating 24, amorphous titanium constitutes the first layer 28 and a titanium nitride (TiN, $Ti_2N$, etc.) constitutes the second layer 30. Multiple alternating layers 28, 30 can be configured to form a lattice structure or a super lattice structure. These are thin films formed by alternately depositing two different components to form layered structures. Multilayers become superlatices when the period of the different layers is less than 100 Å. With this cooperation of structure, a coating 24 having a service life to exceed approximately 100,000 vehicle miles or more can be obtained. Note: the abbreviations (e.g. TiN, $Ti_2N$, etc.) are used herein as a shorthand rather than an exact chemical label, and do not suggest that the stoichiometry of the indicated compound must be exactly as stated in the abbreviation.

FIG. 3B illustrates the optional addition of a surface texture 29 to the surface of substrate 26 prior to application of the coating layers 28 and 30. The surface texture in FIG. 3B is a coarse texture as may be imparted by blasting with irregular shaped particles, as described above, and comprises a series of peaks and valleys with angular apices at each peak and valley. Alternative surface textures may be rounded, cross-hatched, or woven in appearance, as described above. When the textured surface 29 is subsequently coated with one or more coating layers, the resultant, substantially flat surface can exhibit a three dimensional appearance or woven texture. In addition, the composition and thickness of the coating layers can be selected to achieve desired light reflection and absorption characteristics in order to produce an attractive ornamental appearance.

Figure 4:
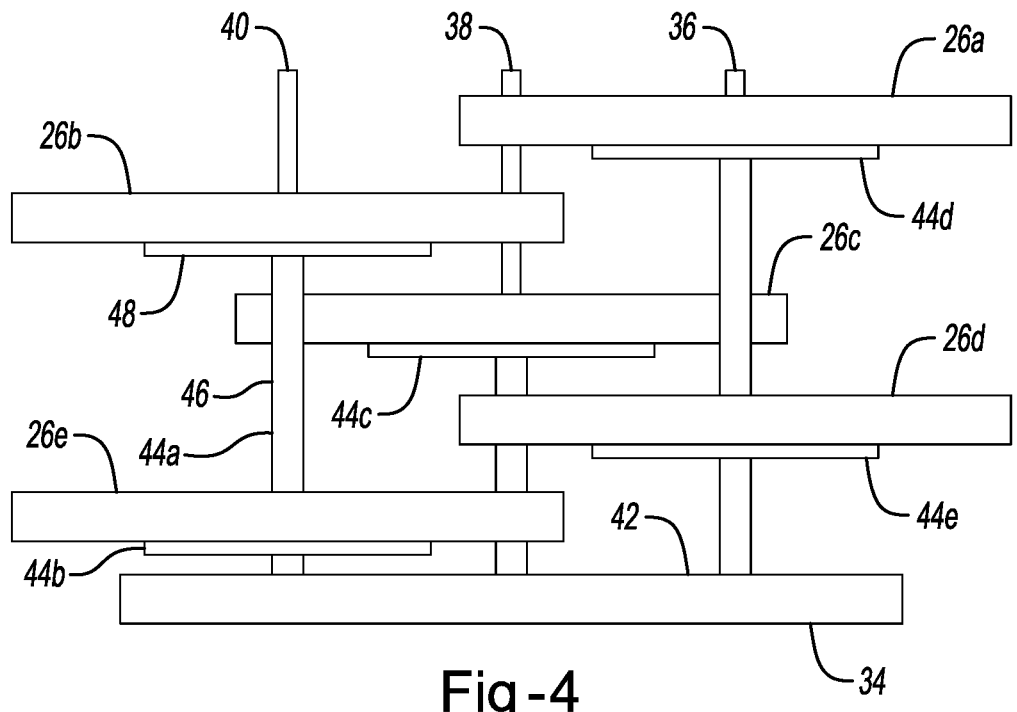
FIG. 4 is a front elevation view of a fixture for supporting the disk brakes during the coating process.
Figure 5:
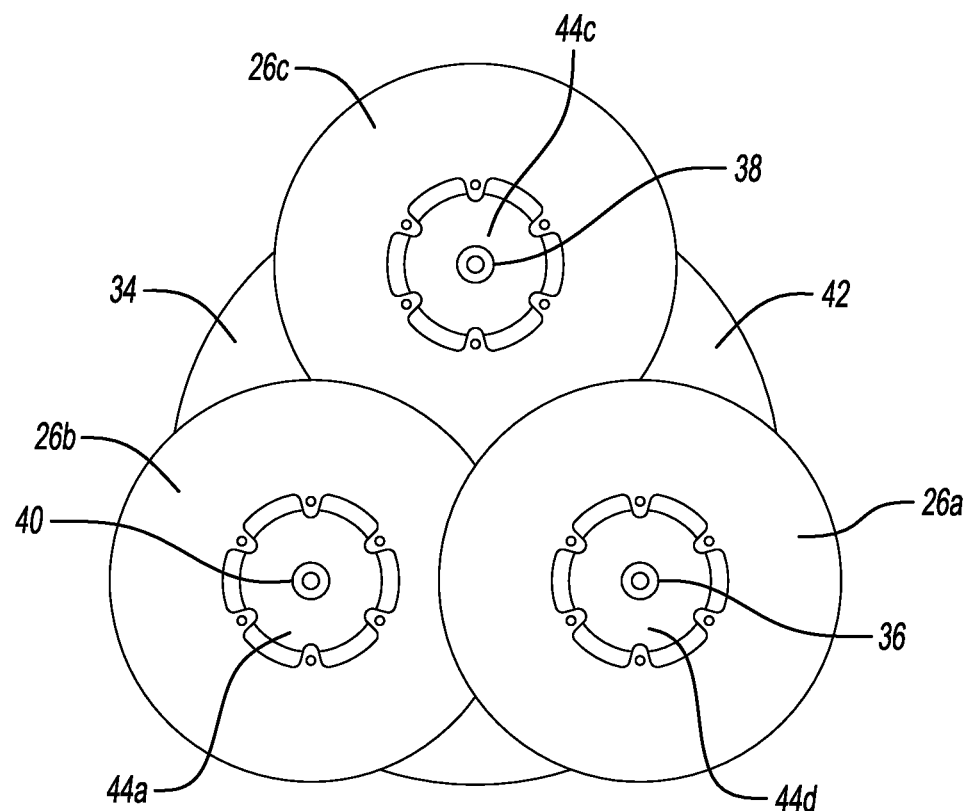
FIG. 5 is a top plan view of a fixture for supporting the disk brakes during the coating process.

Referring now to FIGS. 4 and 5, a fixture 34 is shown for holding the brake disk substrates 26 during coating. Although not visible in FIGS. 4 and 5, the working surfaces of substrates 26a to 26e have plural raised projections or island formations as described above in connection with FIG. 9. Although the fixture 34 is shown holding five brake disk substrates 26a-e, it is to be appreciated that the fixture 34 is merely exemplary and that fewer or more brake disk substrates 26 could be positioned on a fixture 34. As shown, the fixture 34 includes three parallel poles 36, 38, 40 that are mounted on and extend from a base plate 42. Although the fixture 34 only shows three parallel poles 36, 38, 40 it is appreciated that this configuration is only exemplary and that fewer or more parallel poles could be positioned on the fixture 34. The parallel poles 36, 38, 40 are arranged on the base plate 42 with each pole 36, 38, 40 spaced at an equal distance from the other two poles 36, 38, 40. With this cooperation of structure, a plurality of brake disk substrates 26 can be stacked on each pole 36, 38, 40. For example, as shown, brake disk substrates 26a and 26d are stacked on pole 36, brake disk substrate 26c is stacked pole 38 and brake disk substrates 26b and 26e are stacked on pole 40.

As illustrated in FIGS. 4 and 5, spacers 44a-e are used to selectively separate adjacent brake disk substrates 26 on each pole 36, 38, 40. For the implementation shown, each spacer 44a-e includes a tube 46 and flange 48 allowing each spacer 44a-e to be slid over a respective pole 36, 38, 40 and positioned as desired. In the implementation shown in FIGS. 4 and 5, the spacing between poles 36, 38 is established to allow the brake disk substrates 26 on one pole 36, 38, 40 to overlap the brake disk substrates 26 on an adjacent pole 36, 38, 40. Also for the implementation shown in FIGS. 4 and 5, the spacers 44a-e have been sized to prevent brake disk substrates 26 on one pole 36, 38, 40 from contacting the brake disk substrates 26 on an adjacent pole 36, 38, 40.

Figure 6:
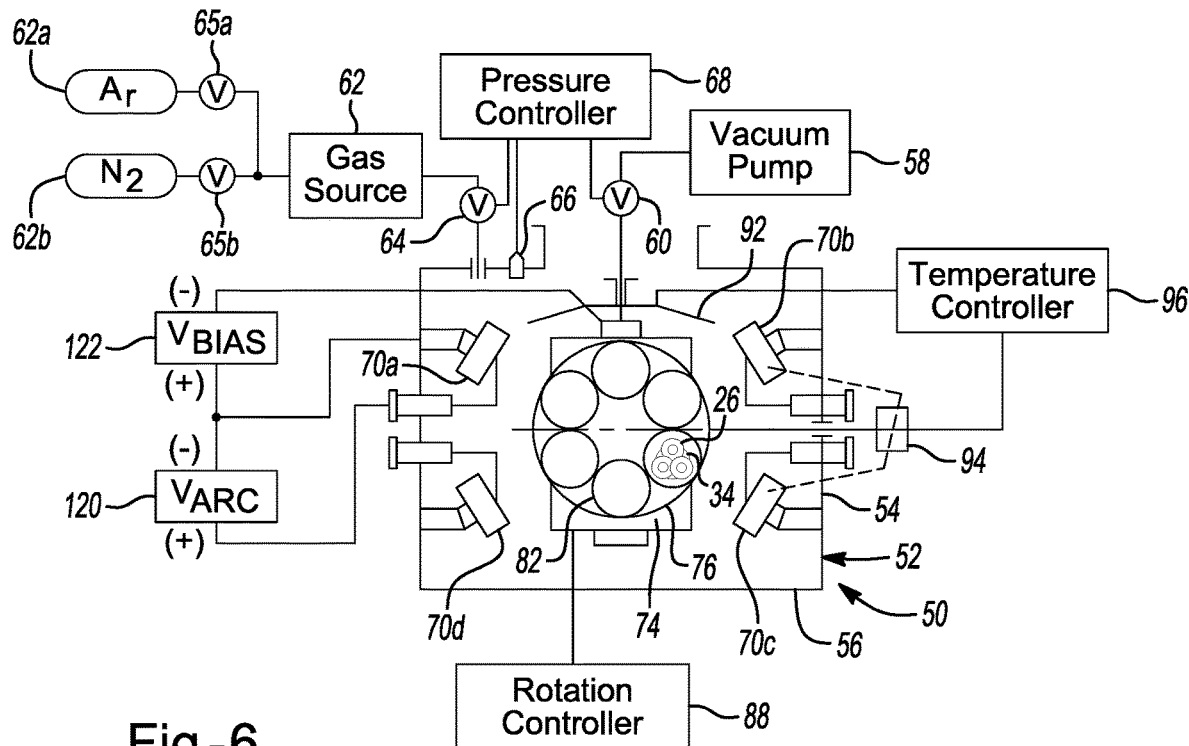
FIG. 6 is a schematic plan view and control diagram of a deposition apparatus for use in the coating process.
Figure 7:
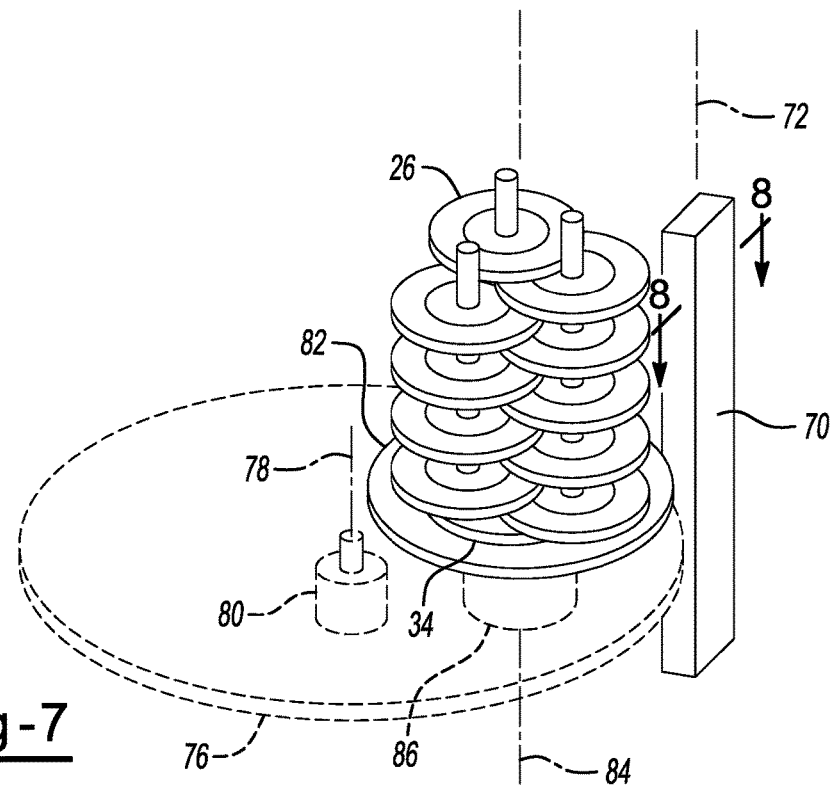
FIG. 7 is a schematic perspective view of a detail of the deposition apparatus of FIG. 5.

FIGS. 6 and 7 depict a deposition apparatus 50 for coating the brake disk substrates 26, although other operable deposition apparatus may be used. The deposition apparatus 50 includes a chamber 52 having a body 54 and a door 56 that may be opened for access to the interior of the chamber 52 and which is hermetically sealed to the body 54 when the chamber 52 is in operation. The interior of the chamber 52 is controllably evacuated by a vacuum pump 58 pumping through a gate valve 60. The vacuum pump 58 includes a mechanical pump and a diffusion pump operating together in the usual manner. The interior of the chamber 52 may be controllably backfilled to a partial pressure of a selected gas from a gas source 62 through a backfill valve 64. The gas source 62 typically includes several separately operable gas sources. The gas source 62 usually includes a source 62a of an inert gas such as argon and a source 62b of Nitrogen gas, each providing gas selectively and independently through a respective selector valve 65a or 65b. Other types of gas can also be provided as desired, such as gases required to produce borides, oxides and/or carbides.

The pressure within the chamber 52 is monitored by a vacuum gage 66, whose output signal is provided to a pressure controller 68. The pressure controller 68 controls the settings of the gate valve 60 and the backfill valve 64 (and, optionally, the selector valves 65), achieving a balance of pumping and backfill gas flow that produces a desired pressure in the chamber 52 and thence pressure reading in the vacuum gauge 66. Thus, the gaseous backfilled atmosphere within the chamber 52 is a flowing or dynamic atmosphere.

In the illustrated embodiment, four linear deposition sources 70 are mounted within the interior of the chamber 52 in a circumferentially spaced-apart manner. In alternative embodiments, a greater or lesser number of linear deposition sources may be used, with two or more deposition sources being used in each embodiment. In FIG. 6, the four deposition sources are identified as distinct sources 70a, 70b, 70c, and 70d, as addressed individually in the subsequent discussion. The four deposition sources 70 are generally rectangular bodies having a greatest rectilinear dimension elongated parallel to a source axis 72. This type of deposition source is distinct from either a stationary point source or a point source that moves along the length of the substrate 26 during deposition procedures.

A support 74 is positioned in the chamber 52. The support 74 produces a compound rotational movement of a fixture 34 mounted thereon. In the illustrated embodiment, the support 74 includes a rotational carriage 76 that rotates about an axis 78, driven by a rotational drive motor 80 below the rotational carriage 76. Mounted on the rotational carriage 76 are six planetary carriages 82. In alternative embodiments, a greater or lesser number of planetary carriages may be used, such as one or more. The planetary carriages 82 are rotationally driven about a rotational axis 84 by a planetary drive motor 86 below the planetary carriages 82 (see FIG. 7). The speeds of the rotational drive motor 80 and the planetary drive motor 86 are controlled by a rotation controller 88. In one embodiment, the rotation controller 88 rotates the rotational carriage 76 at a rate of about 1 revolution per minute (rpm).

Continuing with FIGS. 6 and 7, for deposition processing of brake disk substrates 26, a fixture 34 as described above can be mounted on the planetary carriage 82, as shown. For commercial operations, a fixture 34 having a plurality of brake disk substrates 26 is mounted on each planetary carriage 82 in the manner described, as illustrated for one of the planetary carriages 82 in FIG. 7.

The temperature in the chamber 52 during deposition is controlled using a heater 92 that extends parallel to the deposition sources 70 on one side of the interior of the chamber 52. The heater 92 in one embodiment is a radiant heater operating with electrical resistance elements. The temperature of the heating array is monitored by a temperature sensor 94 such as an infrared sensor that views the interior of the chamber 52. The temperature measured by the sensor 94 is provided to a temperature control circuit 96 that provides the power output to the heater 92. Acting in this feedback manner, the temperature controller 96 allows the temperature of the heating array to be set. In the preferred processing, the heating array is heated to a temperature of from about 1000° F. to about 1700° F.

Figure 8:
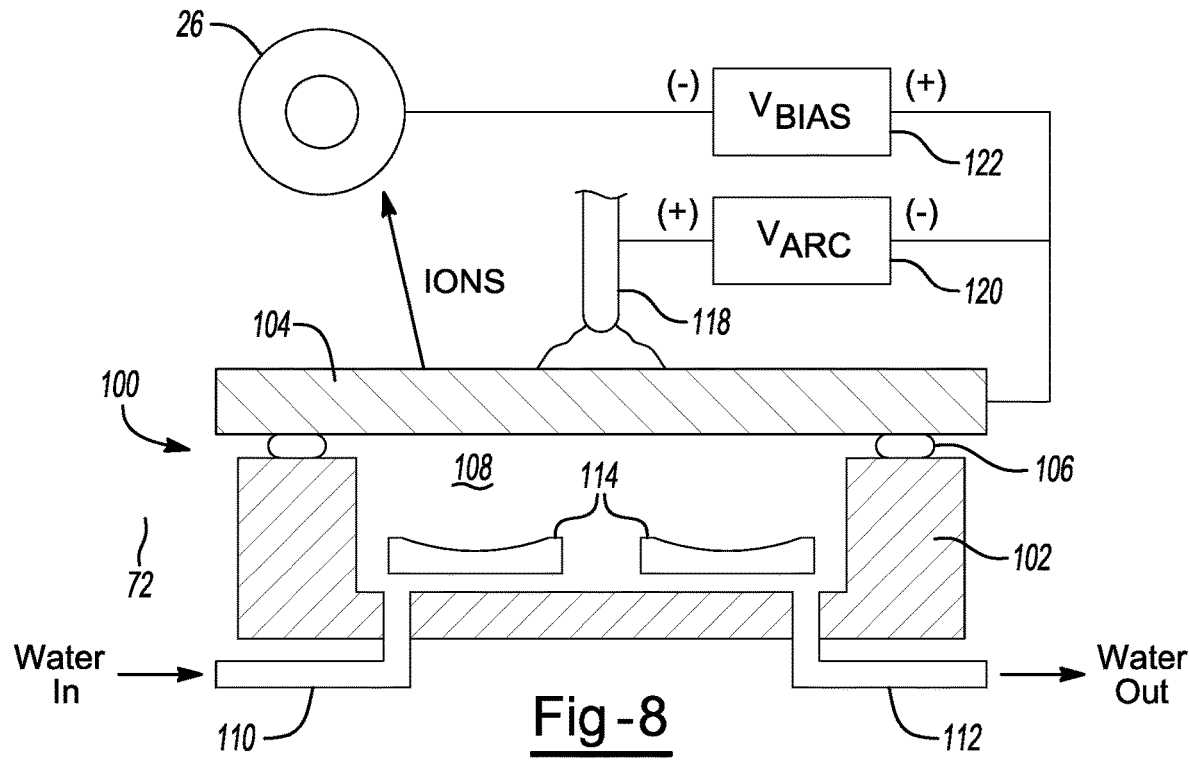
FIG. 8 is a schematic cross-sectional view of the cathodic arc source, taken along lines 8-8 of FIG. 7.

FIG. 8 illustrates a cathodic arc source 100 used in one embodiment of the deposition source 70. The cathodic arc source 100 includes a channel-shaped body 102 and a deposition target 104. The deposition target 104 is in the form of a plate that is hermetically sealed to the body 102 using an O-ring 106, forming a water-tight and gas-tight hollow interior 108. The interior 108 is cooled with cooling water flowing through a water inlet 110 and a water outlet 112. Two spirally shaped (only sections of the spirals are seen in FIG. 8) permanent magnets 114 extend parallel to the source axis 72. Positioned above the deposition target 104 exterior to the body 102 is a striker electrode 118. A voltage VARC is applied between the striker electrode 118 and the deposition target 104 by an arc source power supply 120. In one embodiment, VARC is in the range from about 10 to about 50 volts.

The metallic material that forms the deposition target 104 is deposited onto the brake disk substrate 26 together with, if desired, gas atoms producing gaseous species from the atmosphere of the chamber 52. For the embodiment describe herein, the deposition target 104 is made of Titanium (Ti) metal.

To accomplish the deposition, an arc is struck between the striker electrode 118 and the deposition target 104, locally heating the deposition target 104 and causing Titanium atoms and/or ions to be ejected from the deposition target 104. (The deposition target 104 is therefore gradually thinned as the deposition proceeds.) The striking point of the arc on the deposition target 104 moves in a racetrack course along the length of the deposition target 104. A negative bias voltage VBIAS is applied between the deposition target 104 and brake disk substrate 26 by a bias power supply 122, so that any positively charged ions are accelerated toward the brake disk substrate 26.

In one embodiment, VBIAS is in the range from about −30 to about −600 volts. The value selected for VBIAS determines the energy of ionic impact against the surface of the substrates, a phenomenon termed ion peening. In one case, VBIAS is initially selected to be a relatively large negative voltage to achieve good adherence of the metallic first layer 28 (see FIG. 3A) to the brake disk substrate 26. VBIAS is subsequently reduced (made less negative) when the overlying hard layer is deposited, to achieve a uniform, fine microstructure in the overlying layer. The values of VBIAS are desirably maintained as low as possible, consistent with obtaining an adherent coating 24. VBIAS is more positive than −600 volts, and in one embodiment is more positive than −400 volts. If VBIAS is too negative, corona effects and backsputtering may occur at some regions of the brake disk substrate 26. Thus, while higher VBIAS voltages may be used in some instances, generally it is preferred that VBIAS be more positive than −600 volts. The cathodic arc source 100 is preferred, but other types of sources, such as sputtering sources, may also be used.

The cooperative selection of the material of the deposition target 104 and the gases introduced into the deposition chamber 52 from the gas source 62 allows a variety of coatings 24 to be deposited onto the brake disk substrate 26, within the constraints discussed previously. The total thickness of the coating 24 in one embodiment is in the range from about 1 to about 10 micrometers. If the coating thickness is less than about 1 micrometer, the physical properties of the coating 24 are insufficient to produce the desired results. If the coating thickness is more than about 10 micrometers, the coating 24 has a high internal stress that leads to a tendency for the coating 24 to crack and spall away from the brake disk substrate 26 during deposition or during service.

These general principles are applied in preparing the coatings 24 of interest, as described previously in relation to FIG. 3A. The coating 24 of FIG. 3A includes an amorphous metallic first layer 28, such as amorphous metallic Titanium, that contacts and overlays the surface of the brake disk substrate 26. The amorphous metallic first layer 28 is deposited by backfilling the deposition chamber 52 with a small partial pressure of about 5 microns of an inert gas, such as flowing argon (flowing at a rate of about 200-450 standard cubic centimeters per minute (sccm) in the apparatus used by the inventors), and then depositing metal, such as Titanium, from the deposition target 104 with VBIAS about −400 volts. Because the argon does not chemically react with the metal, an amorphous metallic first layer 28 is deposited.

As shown in FIG. 3A, a second layer 30, which for the embodiment described herein is a metal Nitride, overlies the amorphous metallic first layer 28. The second layer 30 is deposited by backfilling the deposition chamber 52 with a small partial pressure of about 5 microns of flowing Nitrogen (flowing at a rate of about 150-500 standard cubic centimeters per minute in one embodiment), and then depositing metal, such as Titanium, from the deposition target 104 with VBIAS about −50 volts. The metal combines with the Nitrogen to produce the metal Nitride in the second layer 30.

The island formations or raised land portions on the brake disks described above facilitate cooling of the brake disk by increasing and directing air flow around and between the island formations during braking. By increasing the ability of the brake disk to dissipate heat, the risk of brake fade, wear and warpage is reduced, and may potentially increase the effective service life of the brake disk. In addition, the voids or channels between adjacent island formations reduce the overall weight of the brake disk, reducing the amount of material required. Finally, the island formations can be designed to produce a visually attractive appearance in the visible portion of the brake disk, adding to the overall look of a vehicle such as a motor cycle where the brake disks are clearly visible.

Although the embodiments described above are in the form of brake discs, in other embodiments the island formations could alternatively be applied to working surfaces of other brake components for frictional engagement with a braking member, such as the surface of a brake drum which is engaged by a brake shoe in a drum brake arrangement.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

The invention claimed is:

1. A braking surface formed on a substrate material, the braking surface comprising:
    a plurality of spaced surface modifications comprising a friction surface configured to engage a brake pad; and
    a wear and corrosion resistant coating applied to the friction surface, the wear and corrosion resistant coating comprising:
        a first coating layer of a first coating material, the first coating material comprising a crystalline material; and
        a second coating layer of a second coating material;
        wherein the wear and corrosion resistant coating is configured to reduce, during use of the braking surface in braking of a vehicle, wear of the plurality of spaced surface modifications relative to the substrate material in an uncoated state.

2. The braking surface of claim 1, wherein the plurality of spaced surface modifications comprises a plurality of raised formations.

3. The braking surface of claim 1, further comprising grooves extending between the plurality of spaced surface modifications, the grooves comprising a roughened base surface.

4. The braking surface of claim 3, wherein the roughened base surface creates turbulence in air flowing along the grooves in a direction parallel to the friction surface.

5. The braking surface of claim 3, wherein the roughened base surface comprises bumps.

6. The braking surface of claim 1, wherein the first coating material comprises a metal.

7. The braking surface of claim 6, wherein the second coating layer comprises at least one compound of the same metal as the first coating layer.

8. The braking surface of claim 6, wherein the metal of the first coating layer is selected from a group of metals consisting of titanium, chromium, zirconium, boron, hafnium and alloys thereof.

9. The braking surface of claim 8, wherein the second coating layer comprises a nitride, boride, carbide or oxide of the metal used in the first coating layer.

10. The braking surface of claim 1, wherein the plurality of spaced surface modifications are formed of the substrate material.

11. The braking surface of claim 1, wherein the first coating material is applied to at least the friction surface of each surface modification through vapor deposition; and the second coating material is applied over the first coating material through vapor deposition.

12. The braking surface of claim 1, wherein the first coating material and the second coating material are configured to be applied over an entire area of the braking surface.

13. The braking surface of claim 1, wherein the friction surface of each of the plurality of spaced surface modifications comprises a three-dimensional surface texture.

14. The braking surface of claim 13, wherein the three-dimensional surface texture is applied over an entire area of the braking surface.

15. The braking surface of claim 13, wherein the three-dimensional surface texture comprises peaks, valleys, and angular surfaces formed between the peaks and the valleys.

16. The braking surface of claim 13, wherein the three-dimensional surface texture is applied to the friction surface using one or more of bead blasting, sanding, grinding, acid etching, photo-resist etching, roll forming, embossing, stamping, honing, lapping, polishing, blanching, milling, and profiling.

17. The braking surface of claim 13, wherein the first coating layer is configured to be applied to at least the plurality of spaced surface modifications after the three-dimensional surface texture is applied to the friction surface, the first coating layer being configured to be applied through vapor deposition, the first coating layer being configured to be deposited onto the braking surface by energizing a first material source to cause charged particles of the first material source to be dissociated from the first material source and deposited on at least the plurality of spaced surface modifications;
    wherein the second coating layer is configured to be applied to the first coating layer through vapor deposition, the second material of the second coating layer forming a compound, the second coating layer being configured to be deposited by energizing a second material source to cause charged particles of the second material source to be dissociated from the second material source, introducing a reactive gas which reacts with the charged particles of the second material that is deposited on at least the plurality of spaced surface modifications; and
    wherein the vapor deposition causes at least the plurality of spaced surface modifications to exhibit a selected three-dimensional surface texture.

18. The braking surface of claim 1, wherein the substrate material comprises a central opening, and wherein the braking surface further comprises a series of radially extending rows of surface modifications extending from the central opening to an outer periphery of the substrate material.

19. The braking surface of claim 18, wherein the grooves comprise: radially extending spaces between the adjacent rows of surface modifications; and radially spaced gaps between adjacent surface modifications in each row.

20. The braking surface of claim 1, wherein the second coating material is selected from a group of coating materials consisting of metal nitride, metal oxide, metal boride, and metal carbide.

* * * * *